US006650879B1

United States Patent
Underbrink

(10) Patent No.: US 6,650,879 B1
(45) Date of Patent: Nov. 18, 2003

(54) PERSONAL COMMUNICATIONS DEVICE WITH GPS RECEIVER AND COMMON CLOCK SOURCE

(75) Inventor: Paul A. Underbrink, Lake Forest, CA (US)

(73) Assignee: SiRF Technology, Inc., San Jose, CA (US)

(*) Notice: Subject to any disclaimer, the term of this patent is extended or adjusted under 35 U.S.C. 154(b) by 0 days.

(21) Appl. No.: 09/551,060

(22) Filed: Apr. 18, 2000

(51) Int. Cl.[7] ................................................ H04Q 7/20
(52) U.S. Cl. .................... 455/255; 455/259; 455/13.2
(58) Field of Search ................................ 455/456, 11.1, 455/13.2, 13.3, 60, 69, 76, 88, 550, 552, 553, 95, 86, 258, 259, 260, 263, 264, 188.1, 265, 255, 190.1, 192.2; 342/357.02, 357.05, 357.01, 357.12; 701/213, 214

(56) References Cited

U.S. PATENT DOCUMENTS

| 5,119,504 A | * | 6/1992 | Durboraw, III ............. 455/575 |
| 5,523,761 A | * | 6/1996 | Gildea .................... 342/357.03 |
| 5,535,432 A | | 7/1996 | Dent ........................... 455/77 |
| 5,734,966 A | * | 3/1998 | Farrer et al. ............... 455/63.1 |
| 5,841,396 A | | 11/1998 | Krasner ....................... 342/357 |
| 6,002,363 A | * | 12/1999 | Krasner ..................... 342/357.1 |
| 6,041,222 A | | 3/2000 | Horton et al. ............... 455/255 |
| 6,088,348 A | * | 7/2000 | Bell et al. ..................... 370/343 |
| 6,097,974 A | * | 8/2000 | Camp et al. .............. 455/575.7 |
| 6,300,899 B1 | * | 10/2001 | King ....................... 342/357.12 |
| 6,314,111 B1 | * | 11/2001 | Nandikonda et al. ........ 370/473 |

FOREIGN PATENT DOCUMENTS

WO    WO 99/57929    11/1999

* cited by examiner

Primary Examiner—Lee Nguyen
Assistant Examiner—Jean A Gelin
(74) Attorney, Agent, or Firm—Shemwell Gregory & Courtney LLP

(57) ABSTRACT

The invention is directed to a personal telecommunications device having both global positioning systems (GPS) and telecommunications provisions which share a common clock source. GPS provisions include a feedback loop for controlling an oscillator that generates a GPS system signal based upon the common clock signal. The feedback loop includes a frequency synthesizer for generating a feedback control signal, a phase comparator for generating a control signal in accordance with the feedback signal and the common clock signal, and a loop filter for processing and outputting the control signal to the oscillator to control the frequency of GPS system signals.

14 Claims, 8 Drawing Sheets

PERSONAL COMMUNICATIONS DEVICE WITH GPS RECEIVER AND COMMON CLOCK SOURCE

FIELD OF THE INVENTION

This invention is generally related to a personal communications device having global positioning system receiver provisions which are clocked via a clock signal derived from a clock source shared with CDMA based radio. More particularly, the invention provides for a fractional N-synthesizer for providing a feedback signal for controlling an oscillator signal output frequency.

BACKGROUND OF THE INVENTION

Personal communications devices incorporating global positioning (GPS) capabilities are becoming popular. In these devices, the circuitry and components necessary to provide the global positioning capabilities must share the same enclosure and circuit board real estate as the circuitry and components dedicated to providing, for example, mobile (cellular) telephone capabilities. Further, circuitry and components for both, GPS capabilities as well as mobile telephone capabilities are powered by the same power source, typically, via an on-board battery. While battery technology is improving, it is typical that the more power consumed by a device the larger the physical size of the battery necessary to provide a given operating time.

The demand for smaller, more compact personal communication devices is increasing. Concurrent with this increasing demand for compactness is the demand for devices that provide for increased functionality and capabilities. As functionality and capabilities increase, typically, so does the need for power and printed circuit real estate within the personal communications device.

In personal communications devices such as that shown in the block diagram of FIG. 1, wherein there is provided a personal communications device that incorporates a global positioning systems (GPS) receiver 100 and a code division multiple access (CDMA) based telecommunications device 200, it is common for separate clock sources (oscillators) to be associated with the GPS receiver 100 and the CDMA device 200. More particularly, GPS receiver 100 includes an associated oscillator 101 while CDMA device 200 includes an associated oscillator 201. Each oscillator, 101 and 201 provides a clock signal to the respective circuitry to which it is associated.

FIG. 2 shows a GPS receiver 100, which includes an oscillator 101. Oscillator 101 provides a signal of a particular frequency to phase comparator 146. Phase comparator 146 also receives input from frequency divider 136 and outputs a signal to loop filter 145. Loop filter 145 provides a signal to voltage controlled oscillator (VCO) 115 which generates an output signal whose frequency is contingent upon the signal input from loop filter 145. The signal from VCO 115 is provided to mixer 110 where it is combined with a radio frequency (RE) signal from low noise amplifier (LNA) 105 to produce a first intermediate frequency (EF) signal S1. The first IF signal S1 is provided to variable amplifier 112 and then on to mixer 120 and mixer 121. In mixer 120, the signal S1 is combined with a signal S2 from frequency divider 130 to produce an in-phase second IF frequency output signal S3. In mixer 121, the signal S1 is combined with a signal S4 from frequency divider 130 to produce a quadrature phase second IF frequency output signal S5. Signal S3 is provided to comparator and A to D processor 125 to produce a digitized signal 1 for output to GPS baseband section 150. Signal S5 is provided to comparator and A to D processor 126 to produce a digitized signal Q for output to GPS baseband section 150. Frequency divider 130 also provides its output signal S4 to frequency divider 135 and frequency divider 136. The output from VCO 115 is also provided to the frequency divider 130. Frequency divider 130 outputs a signal S4 that is mixed by mixer 121 with a signal S1 to produce a signal S5.

As two separate oscillators are provided within the same personal communications device 10, printed circuit board and/or integrated circuit real estate is devoted to accommodating each oscillator. Another disadvantage is that power consumption of the two oscillators is greater than for one oscillator. Thus it is desirable to have a personal communications device that overcomes the stated disadvantages.

SUMMARY OF THE INVENTION

This invention is directed to a personal telecommunications device having both global positioning systems (GPS) and telecommunications provisions that share a common clock source. GPS provisions include a feedback loop for controlling an oscillator generating a GPS system signal based upon the common clock signal. The feedback loop includes a frequency synthesizer for generating a feedback control signal, a phase comparator for generating a control signal in accordance with the feedback signal and the common clock signal, and a loop filter for processing and outputting the control signal to the oscillator to control the frequency of GPS system signals.

The invention provides a system for providing a clock signal to a global positioning system (GPS) receiver based upon a common clock source. In the architecture, the system may be implemented with a personal communications system that includes a telecommunications unit, a global positioning systems (GPS) receiver, and a common clock source for providing a clock signal to the global positioning receiver and the telecommunications unit. The GPS receiver includes a frequency synthesizer for providing a feedback signal for controlling an oscillator to provide a GPS system clock signal.

The invention can also be viewed as providing a method for a system clock signal to a GPS receiver. In this regard, the method can be broadly summarized by the following steps: receiving a clock signal from a clock source; generating a control voltage for controlling the frequency of an oscillator signal generated by an oscillator based upon a feedback signal from a frequency synthesizer; and generating a system clock signal of a particular frequency in response to the control voltage.

Other systems, methods, features, and advantages of the invention are available to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon clearly illustrating the principles of the invention. In the figures, like reference numerals designate corresponding parts throughout the different views.

DETAILED DESCRIPTION OF THE PREFERRED EMBODIMENT

The invention seeks to provide a personal communications device having global positioning system (GPS) capabilities. The invention seeks to provide a personal communications device in which a single oscillator acts as a clock source for both mobile telephone circuitry and global positioning system (GPS) circuitry. GPS circuitry includes fractional synthesizer provisions for controlling the generation of the frequency of signals based upon the oscillatory.

Figure 1:
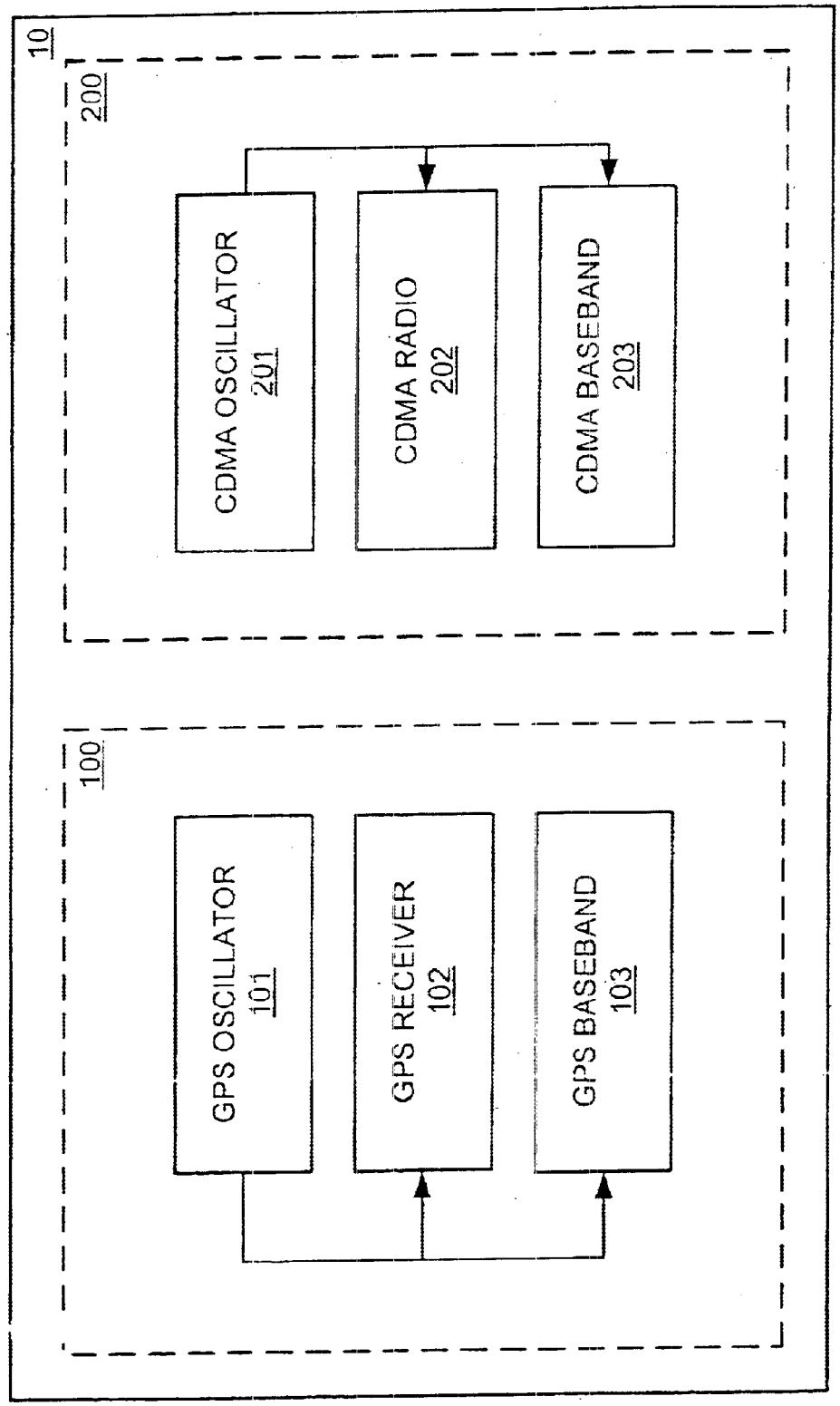
FIG. 1 is a block diagram of a typical personal communications device.
Figure 2:
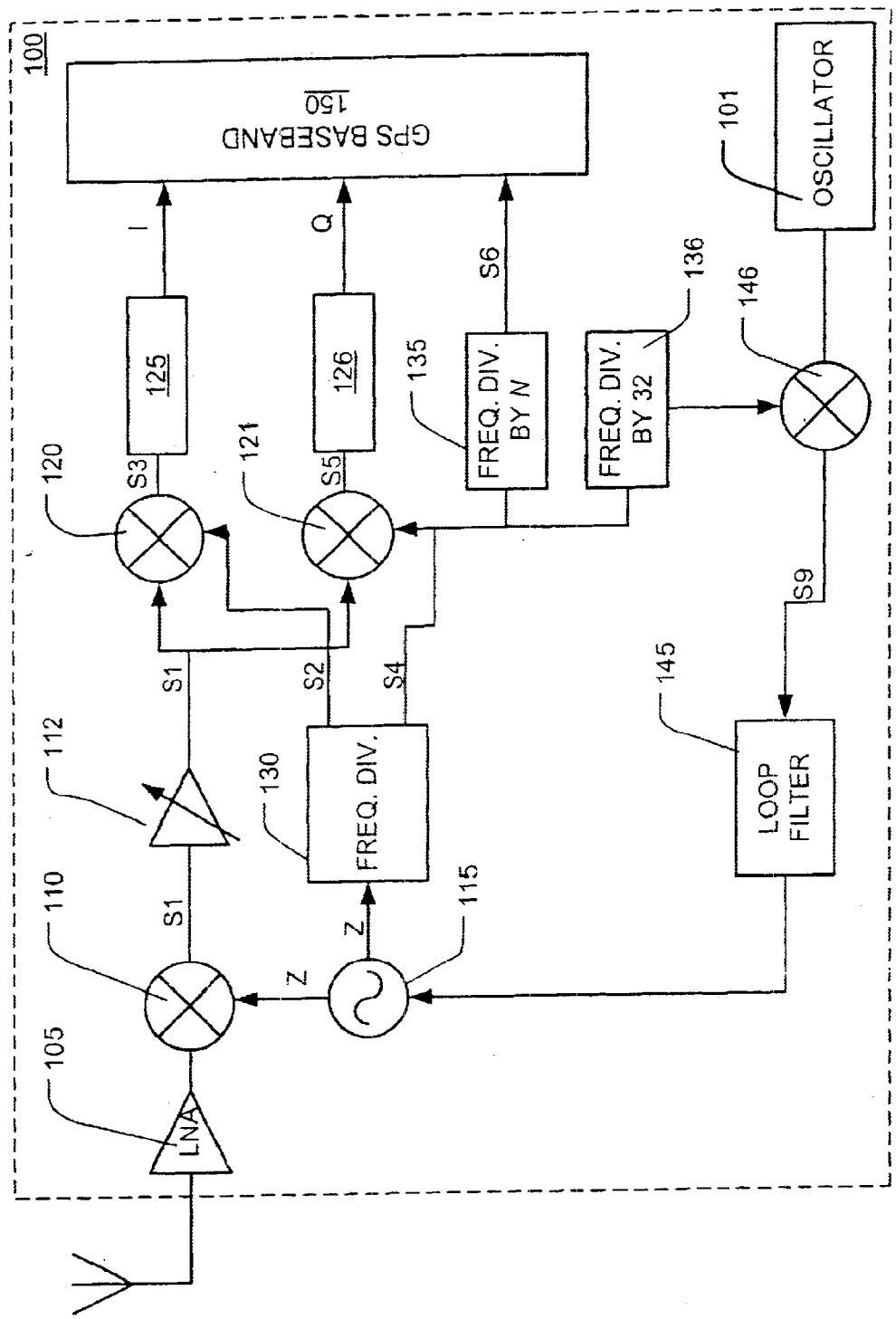
FIG. 2 is a schematic diagram of a GPS receiver.
Figure 3:
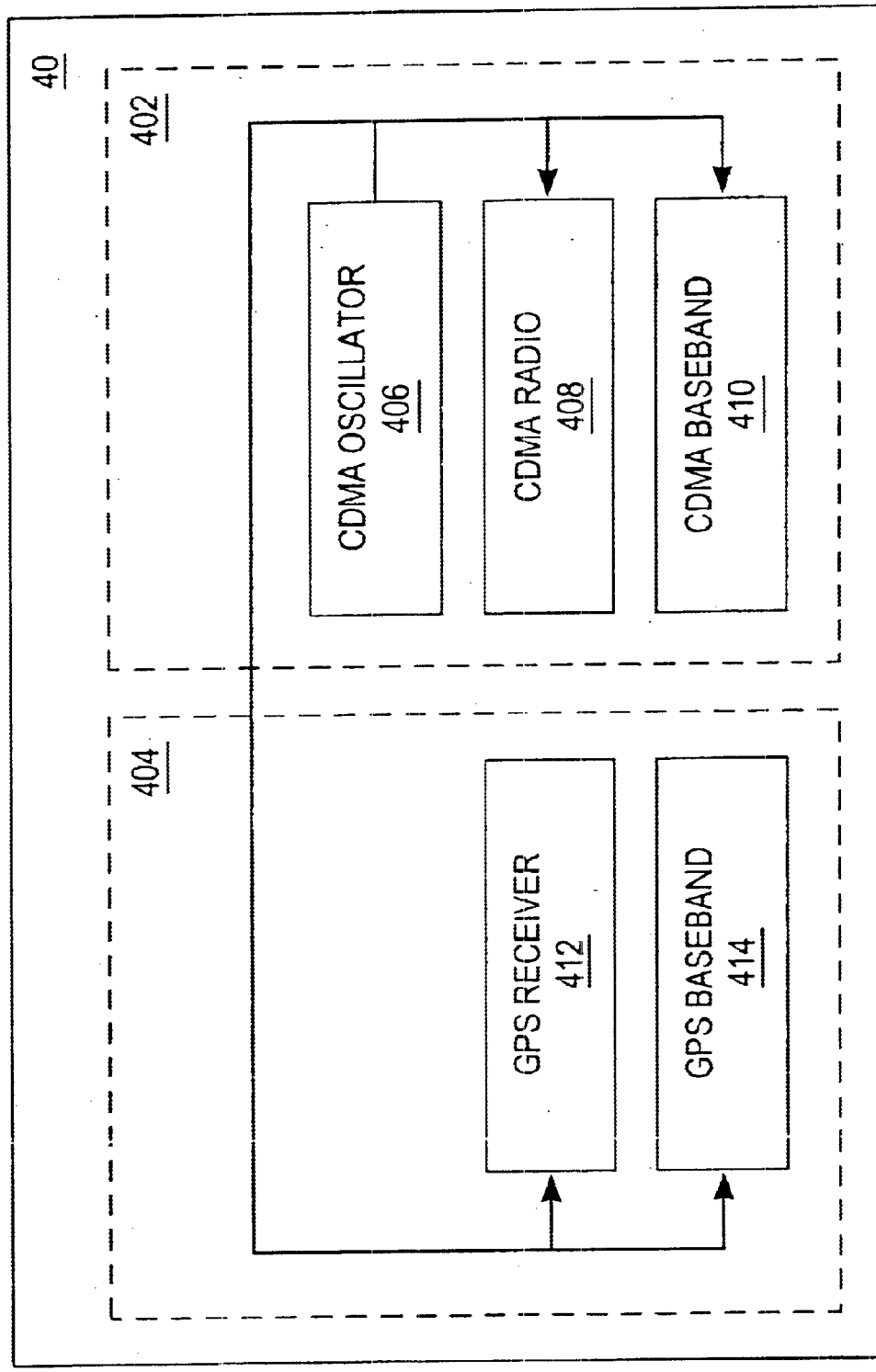
FIG. 3 is a block diagram of the invention.

FIG. 3 shows a block diagram of a personal communications device according to an embodiment of the invention. There is provided a global positioning system (GPS) receiver 40 and a code division multiple access (CDMA) base telecommunications unit 402. GPS receiver 40 includes a GPS radio 412 and a GPS baseband unit 414. GPS radio 412 receives and processes GPS signals and provides them the baseband unit 414 for further extraction of data from a received GPS signal. There is also provided a CDMA radio unit 408 for receiving, processing and transmitting CDMA based RF signals and a CDMA baseband unit 410 for further processing of CDMA based RF signal received or to be transmitted. CDMA telecommunications unit 402 includes an oscillator 406 for providing a clock signal to circuitry of CDMA telecommunications unit 402 and to GPS receiver 404. More particularly CDMA oscillator 406 provides a clock signal to CDMA radio 408, CDMA baseband unit 410 and to GPS receiver 412 and GPS baseband unit 414.

Figure 4:
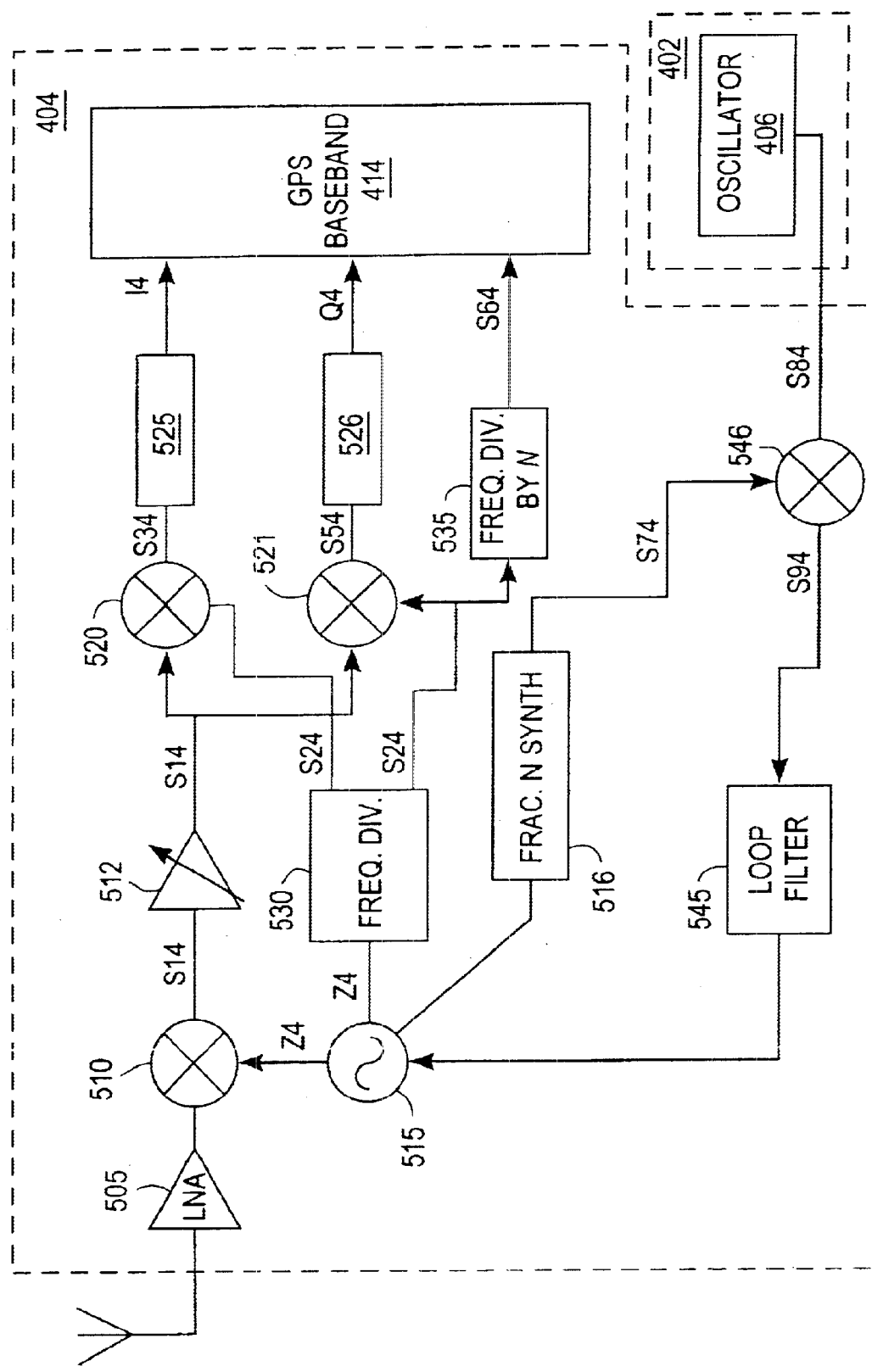
FIG. 4 is a schematic diagram of a personal communications device according to the invention.

FIG. 4 shows a diagram detailing GPS receiver 404. There is provided a voltage controlled oscillator (VCO) 515 which generates a GPS system clock signal Z4 whose frequency is contingent upon the voltage input from loop filter 545. The signal from VCO 5151 is provided to mixer 510 where it is combined with a received radio frequency (RF) input signal from low noise amplifier (LNA) 505 to produce a first intermediate frequency (IF) signal S14. This fist IF signal S14 is provided to amplifier 512 and then to mixer 520 and mixer 521. At mixer 520, it is combined with a signal S24 from frequency divider 530 to produce a second IF frequency output signal S34. At mixer 521, first IF signal S14 is combined with a signal S44 also from frequency divider 530 to produce a further IF frequency output signal S54. Signal S44 is also provided to frequency divider 535 where it is converted into a signal of alternate frequency S64 and output to GPS baseband unit 414.

Signal S34 is input to comparator and A to D processor 525 where it is processed and converted into a digital output signal 14 for input to GPS baseband unit 414. Likewise signal S54 is input to comparator and A to D processor 526 where it is processed and converted into digital output signal Q4 which is provided to GPS baseband unit 414.

The GPS system clock signal Z4 output from VCO 515 is also provided to frequency divider 530 and a frequency synthesizer 516. Frequency synthesizer 446 convert the signal Z4 from VCO into a feedback signal S74 that is provided to phase comparator 546 which outputs a control signal S94 to loop filter 545 in response to the input of the feedback signal S74 and the clock signal S84 from oscillator 406. Control signal S94 is then provided to VCO 515, which adjusts the frequency of output signal Z4 in accordance with the control signal S94. In this illustration it can be seen that there is formed a feedback loop composed of frequency synthesizer 516, phase comparator 54 and loop filter 545.

Figure 5:
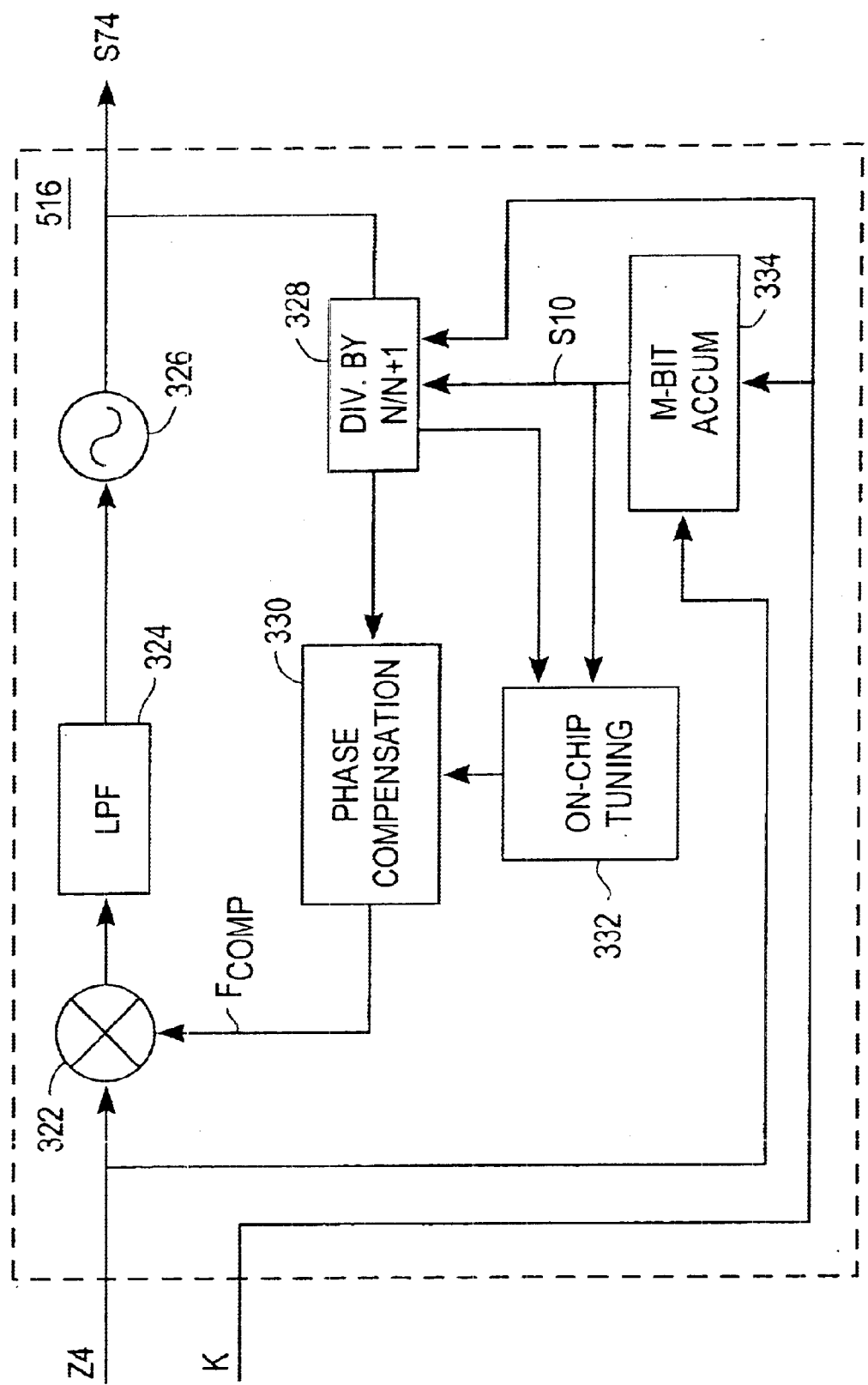
FIG. 5 is a schematic diagram of a fractional-N frecuency synthesizer.

FIG. 5 is a block diagram of the phase interpolated fractional N frequency synthesizer 516. The synthesizer 516 can be implemented as an integrated circuit using known CMOS fabrication methods or other compatible semiconductor chip technologies. In FIG. 5, a reference signal Z4 from VCO 515 is provided to an input of a phase detector 322. The output of the phase-detector 322 is provided to a loop filter 324. The output of the loop filter 324 is provided to a controlled oscillator 326, such as a VCO, which has an output S74 (feedback signal S74) that is the output of the synthesizer 516. The signal S74 is supplied to a fractional-N divider 328. A control word K is supplied to the fractional-N divider 328 in order to set the value of the divisor N.

The output of the fractional-N divider 328 is provided to a phase compensation circuit 330 and to an on chip tuning circuit 332, which in combination are referred to as a phase compensator. The output (fcomp) from the phase compensation circuit 330 is provided as the second input to the phase detector 322. An accumulator 334 also receives control word K and the signal Z. The carry out port (the carry signal S10) from the accumulator 334 also serves as an input to the fractional-N divider 328. The signal Z serves as the clocking signal for the accumulator 334. The signal S10 from carry out port of the accumulator 334 triggers the divide by the N+1 function of the fractional-N divider.

The phase detector 322, loops filter 324 and VCO 326 may be of any suitable type known to those of ordinary skill. The types of phase detectors, loop filters, VCOs and fractional-N dividers commonly used in fractional-N synthesizers can be used for the synthesizer 320, such as voltage or current controlled oscillators, phase or phase/frequency detectors, active or passive loop filters and loop filters with charge pumps.

Figure 6:
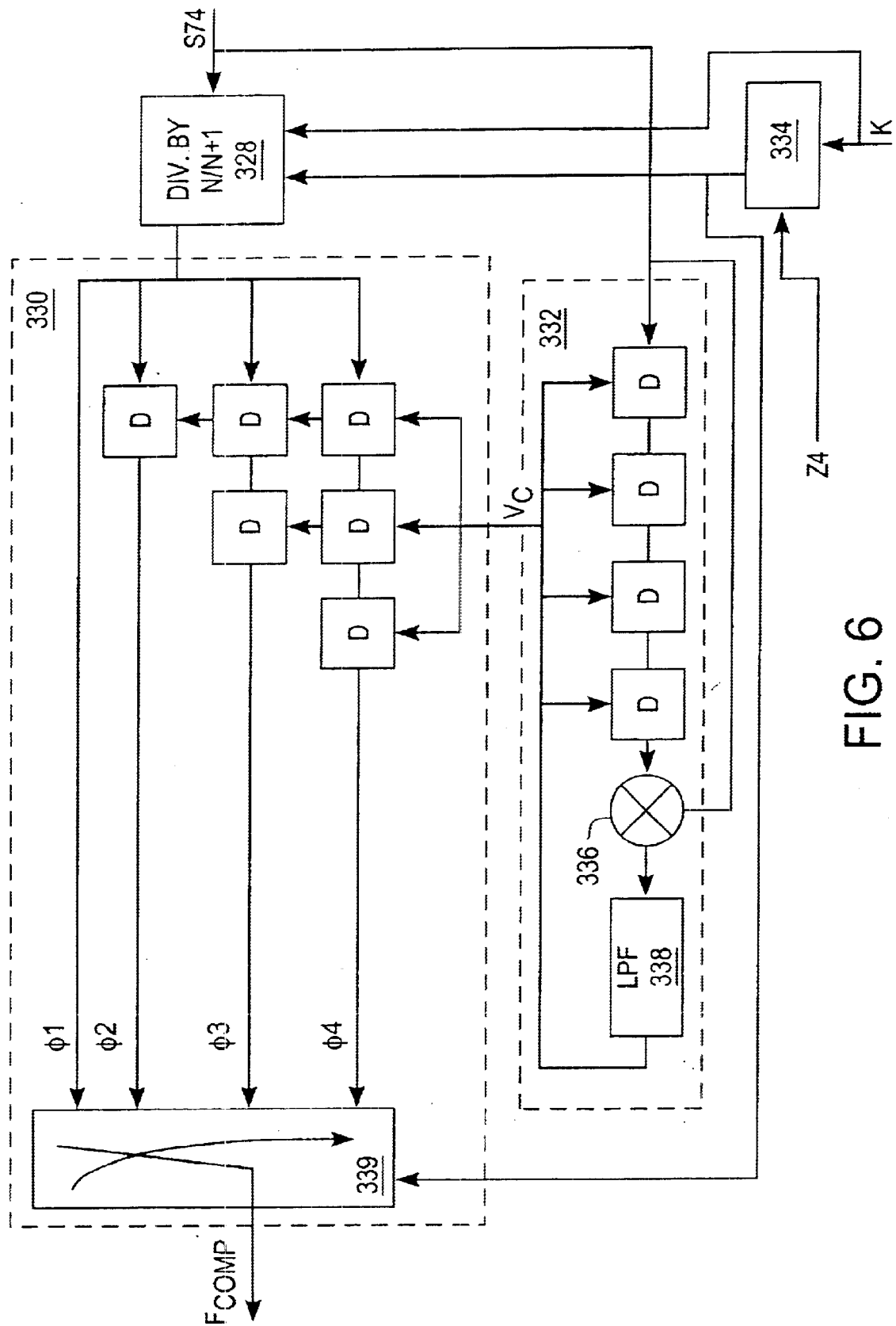
FIG. 6 is a detailed description of an embodiment of a phase compensation circuit and an on-chip tuning circuit.

FIG. 6 shows a more detailed description of an embodiment of phase compensation circuit 330 and on-chip tuning circuit 332. Phase compensation circuit 330 and on-chip tuning circuit 332 may be implemented using an arrangement of voltage controlled delay elements (D) where the amount of delay elements D provides a signal delay of Tvco/4, where Tvco equals the period of the frequency of the output S10 of the VCO 326.

The output of the fractional-N divider 328 is applied to the series of delay lines whose outputs are identified as $\phi1$–$\phi4$. It will be noted that $\phi1$ has no delay elements, while $\phi2$ has a single delay element, $\phi3$ has two delay elements and $\phi4$ has three delay elements. The signals $\phi1$–$\phi4$ are provided to control circuitry 339 that has an output signal fcomp that is applied to an input of the phase detector 322 as shown in FIG. 5. The output fcomp of control circuitry 339 is selectively switched among the inputs $\phi1$–$\phi4$ according to the output of the accumulator 334 which is provided to the control circuit 339.

The on-chip tuning circuit 332 includes four voltage control delay elements D, a phase detector 336 and a loop filter 338. In the on-chip tuning circuit 332 is implemented as a delay locked loop. The signal S10 from VCO 326 passes through the four delay elements (D) of the on-chip tuning circuit 332 and is then provided to the phase detector 336. In addition S10 is also applied to the phase detector 336. The phase detector 336 outputs a signal proportional to the difference in phased between the two input signals. The output of the phase detector 336 then passes through a loop filter 338. The output Vc of the loop filter 338 is used as a control voltage for each of the delay elements D of the on-chip tuning circuit 332. Control voltage Vc is also applied to each delay element (D) of the tuning circuit 332 is ¼ the period of the frequency of the input signal to the delay locked loop. The tuning circuit 332 determines or adjusts the value of the delay elements according to the input frequency.

Figure 7:
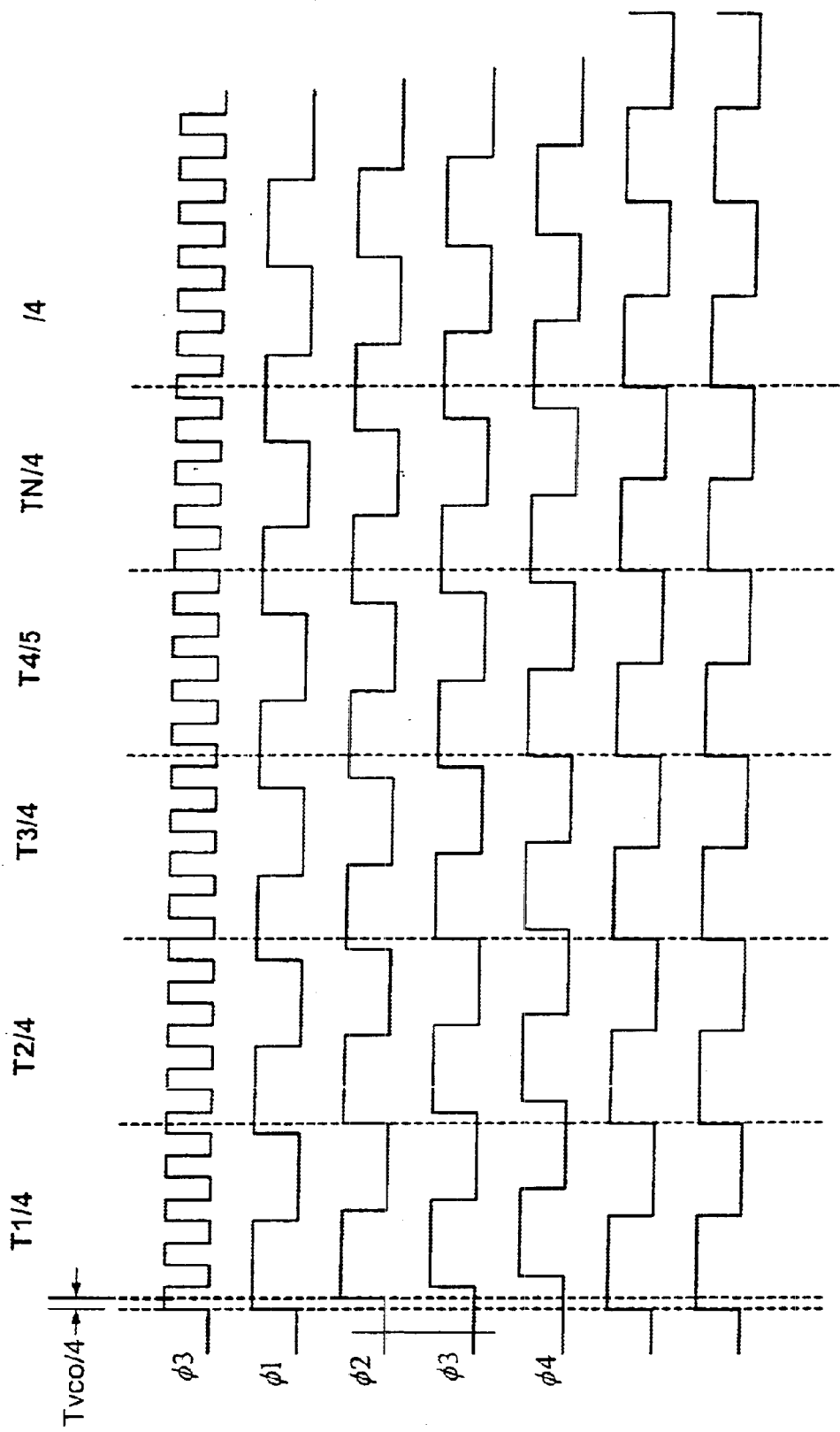
FIG. 7 is a timing diagram illustrating the relationship between signals of the frequency synthesizer in relation to the signals of the compensation circuit.

FIG. 7 illustrates a timing diagram which illustrates the relationship between various signals of the synthesizer 116 in relation to the signals of the compensation circuit 330 and on-chip tuning circuit 332. More particularly, FIG. 6b illustrates an example wherein S10=4.25(Z). In this example, the divider 328 is programmed for N=4 (via control word K). The accumulator 334 is programmed (via control word K) to generate a carry signal at every fourth cycle of the signal Z. Each time interval T is equal to one cycle of Z. During the time interval T1–T4, S10 has 17 cycles and Z has 4 cycles. During the time interval T1, the fractional-N divider 328 divides the signal S10 by 4. In the second time period T2 and the third time period T3, the divider 328 again divides the signal S10 by 4. At the beginning of the fourth time period, T4, the accumulator 334 generates the carry signal which causes the divider to divide by N+1, in this example N+1=5. Therefore, signal Z is divided by five during T4.

During the time period T1, the phase compensation circuit 330, more specifically, control circuit 339, provides the signal $\phi1$ to the phase detector 322. At the beginning of the time period T1, signal $\phi1$ is in phase with the signal Z. At the beginning of the time period $\phi2$, the output of the phase compensation circuit 330 switches to $\phi2$. Switching of the output of the control circuit 339 is controlled by the output of the accumulator 334, which is clocked by the signal Z. It will be noted that $\phi2$ is in phase with Z at the output of the phase compensation circuit 330. Similarly, at the beginning of the time period T3, the output of the phase compensation circuit 330 switches to 43 and then at the beginning of the time period T4, the output of the phase compensation circuit 330 switches to $\phi4$. The pattern then repeats. In this way, compensation for the phase lag of the divider 328 is accomplished.

Figure 8:
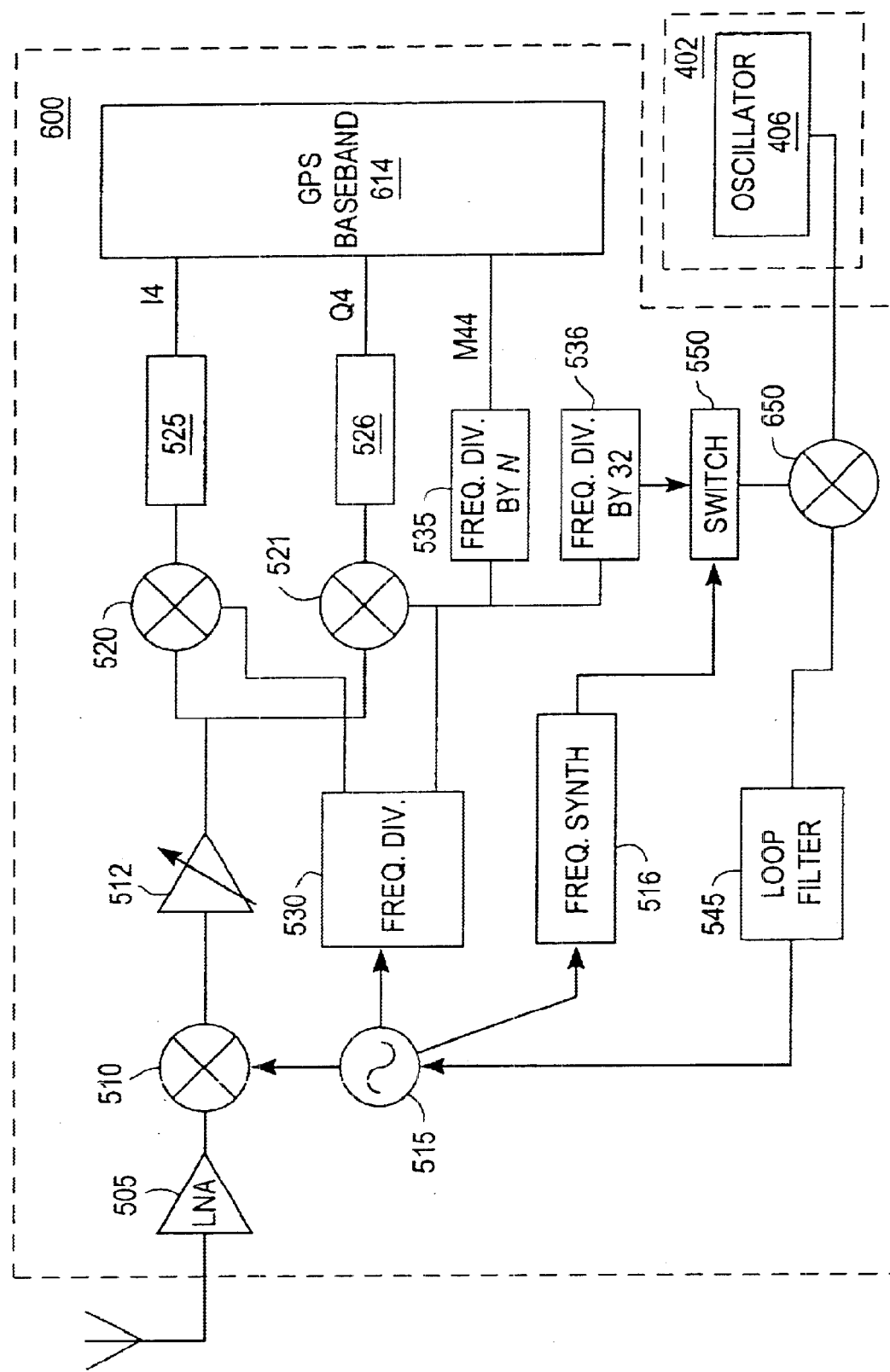
FIG. 8 is a diagram showing a further embodiment of the invention.

FIG. 8 illustrates an alternate embodiment of a GPS receiver 600 in which provisions are made for selectively providing feedback to phase comparator 650 via a fractional N synthesizer 516 or a frequency divider 536. In this embodiment a switch 550 is provided for switching between the output of fractional N synthesizer 516 or frequency divider for input to phase comparator 650. Switch 550 may be multiplexor or other logic gating. Further, switch 550 can be permanently set to a desired position during manufacture or could remain selectively switchable and controllable via application of an appropriate switching signal, generated for example by a GPS baseband unit 614.

OTHER EMBODIMENTS

The present invention can be implemented in the systems described in U.S. in U.S. Pat. No. 5,874,914 for "GPS Receiver Utilizing A Communication Link" and in U.S. Pat. No. 5,841,396 also, for a "GPS Receiver Utilizing A Communication Link". Here there is disclosed a global positioning system (GPS) receiver which incorporates a first antenna for receiving a GPS signal and a downconverter coupled to the first antenna. The first antenna provides the GPS signals to the downconverter. A local oscillator is coupled to the downconverter and provides a reference signal to the downconverter to convert the GPS signals from a first frequency to a second frequency. A second antenna is provided for receiving a precision carrier frequency signal from a source of the precision carrier frequency signal. An automatic frequency control (AFC) circuit is coupled to the second antenna. The AFC circuit provides a second reference signal to the local oscillator to calibrate the first reference signal from the local oscillator. The local oscillator is used to acquire the GPS signals.

There is also described a mobile, GPS receiver having a first antenna for receiving GPS signals and a downconverter coupled to the first antenna. The first antenna provides the GPS signals to the downconverter. The downconverter has an input for receiving a local oscillator signal to convert the GPS signals from a first frequency to a second frequency. The second antenna is provided for receiving a precision carrier frequency signal from a source providing the precision carrier frequency signal. An automatic frequency control (AFC) circuit is coupled to the second antenna. The AFC circuit is also coupled to the downconverter to provide the local oscillator signal that is used to acquire the GPS signals. The disclosures of U.S. Pat. No. 5,874,914 and U.S. Pat. No. 5,841,396 are hereby incorporated by reference.

Further, the present invention can be implemented in the system described in U.S. Pat. No. 6,002,363 for "Combined GPS Positioning Systems and Communication System Utilizing Shared Circuitry." The disclosure of U.S. Pat. No. 6,002,363 is hereby incorporated herein by reference. U.S. Pat. No. 6,002,363 discloses among other things, a GPS receiver which includes a GPS antenna for receiving data representative of GPS signals from at least one satellite; a digital processor coupled to the GPS antenna, the digital processor processes the data representative of GPS signals from at least one satellite, including performing a matched filtering operation to determine a pseudorange based on the data representative of GPS signals. The digital processor also processes communication signals received through a communication link, the processing of communication signals comprising demodulation of communication signals sent to the GPS receiver.

Additionally, the present invention can be implemented in the system described in U.S. Pat. No. 5,734,966 for a "Wireless Communications System For Adapting to Frequency Drift." The disclosure of U.S. Pat. No. 5,734,966 is hereby incorporated herein by reference. U.S. Pat. No. 5,734,966 discloses among other things a frequency tolerant wireless transceiver to receive and transmit on the wireless signal energy on the same frequency and to automatically adjust to that frequency, the transceiver includes: an antenna to receive a wireless data signal, including application data from one or more remote transceivers, at an actual frequency and issue this signal as a conducted radio frequency (RF) data signal and to transmit a wireless return signal at the actual frequency to the remote transceiver in response to a conducted RF return signal; a synthesizer to generate a local oscillator (LO) signal sequentially in response to a first and a second frequency control signal, and to generate the RF return signal at the actual frequency in response to the second frequency control signal and having modulation in response to a digital return signal; a direct conversion receiver to receive the LO signal to down convert the RF data signal to a baseband data signal; a frequency discriminator to receive the baseband data signal, to provide a frequency difference signal for the current frequency difference between the expected frequency and the actual frequency, and to demodulate the baseband data signal, and to issue a demodulated data signal; and a microcontroller system having a receive adjust mode to provide the first frequency control signal predictive of an expected frequency and to receive the frequency difference signal, having a receive data mode to process the frequency difference signal, to provide the second frequency control signal predictive of the actual frequency, and to receive the demodulated data signal, including the application data, and to provide the digital return signal.

There is further disclosed a frequency tolerant transceiver to automatically adjust to receive a radio frequency (RF) data signal on an actual frequency and to transmit an RF return signal on that same frequency, the transceiver comprising: a synthesizer for sequentially generating a local oscillator (LO) signal and the RF return signal, the LO signal sequentially having a first frequency corresponding to an expected frequency of the RF data signal and a second frequency corresponding to the actual frequency of the RF data signal in response to a first and a second frequency control signal, respectively, the RF return signal having the second frequency in response to the second frequency control signal; and a microcontroller system having a receive adjust mode for providing the first frequency control signal predictive of the expected frequency and providing the second frequency control signal for the actual frequency based upon a frequency difference between the actual frequency and the expected frequency.

The personal communications device of the invention can be implemented in hardware, software, firmware, or a combination thereof. In the preferred embodiment(s), the personal communications device is implemented in software or firmware that is stored in a memory and that is executed by a suitable instruction execution system. If implemented in hardware, as in an alternative embodiment, the personal communications device of the invention can implemented with any or a combination of the following technologies, which are all well known in the art: a discrete logic circuit(s) having logic gates for implementing logic functions upon data signals, an application specific integrated circuit having appropriate logic gates, a programmable gate array(s) (PGA), a fully programmable gate array (FPGA), etc.

It should be emphasized that the above-described embodiments of the invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the invention and protected by the following claims.

What is claimed is:

1. A personal communications device comprising:
  a telecommunications unit comprising a code division multiple access (CDMA) device, wherein the telecommunications unit further comprises a clock source; and
  a global positioning system (GPS) receiver, wherein the GPS receiver comprises a voltage controlled oscillator for generating a GPS system clock signal based upon the clock source, and a feedback loon for controlling the voltage controlled oscillator, wherein the feedback loon comprises,
    a phase comparator for generating a control signal in accordance with the feedback signal and the clock source; and
    a loop filter for processing the control signal and outputting the control signal to the voltage controlled oscillator.

2. The personal communications device of claim 1 wherein the clock source provides a common clock signal to the global positioning receiver and the telecommunications unit.

3. The personal communications device of claim 1 wherein the clock source comprises a crystal oscillator.

4. The personal communications device of claim 1 wherein the frequency synthesizer comprises:
  a controlled oscillator having a variable output controlled by an input signal;
  a frequency divider coupled to receive the output of the controlled oscillator and responsive to the output to provide a frequency divided output signal;
  a phase compensation circuit coupled to receive the frequency divided output signal from the frequency divider, the phase compensation circuit responsive to the frequency divided output signal to provide an output which compensates for phase lag of the frequency divided output of the frequency divider; and
  a phase detector coupled to receive an output of the phase compensation circuit and the GPS system clock signal and to output a signal proportional to difference in phase between the output of the phase compensation circuit and the GPS system clock signal to control the controlled oscillator.

5. The personal communications device of claim 1 wherein the divider is a fractional-N divider.

6. The personal communications device of claim 1 wherein the controlled oscillator is a voltage controlled oscillator.

7. The personal communications device of claim 1 further comprising a switch for selectable engaging the feedback loop to control the voltage controlled oscillator.

8. The personal communications device of claim 1 wherein the switch is permanently set during manufacture.

9. A method of clocking GPS receiver operations comprising the steps of:
  receiving a clock signal from a clock source;
  generating a control voltage for controlling frequency of an oscillator signal generated by a voltage controlled oscillator based upon a feedback signal generated by a frequency synthesizer; and
  generating a system clock signal of a particular frequency in response to the control voltage, wherein the frequency synthesizer generating the feedback signal includes,
    receiving the system clock signal;
    frequency dividing the system clock signal by at least two integer values to generate a fractional-N divider signal over a discrete time period;
    generating a variably delayed signal based upon the fractional-N divided signal within the discrete time period; and
    comparing a phase of the variably delayed signal and a reference signal and varying the system clock signal according to a detected phase difference.

10. A method of clocking GPS receiver operations according to claim 9, wherein the clock source comprises a crystal oscillator of a telecommunications unit.

11. A method of clocking GPS receiver operations according to claim 9, wherein the telecommunications unit comprises a CDMA based telecommunications unit.

12. A personal communications device comprising:

means for receiving a telecommunications signal;

means for receiving a global positioning system (GPS) signal comprising an oscillator for generating a GPS system clock signal and a feedback loop for generating and providing a control signal to the oscillator; and means for generating a clock source signal to be provided to the means for receiving a global positioning system (GPS) signal and the means for receiving a telecommunications signal, wherein the feedback loop comprises, a frequency synthesizer for generating a feedback signal; and a phase comparator for generating a control signal in accordance with the feedback signal and the clock source signal.

13. A personal communications device according to claim 12 wherein the means for receiving a telecommunications signal comprises a code division multiple access (CDMA) based radio frequency receiver.

14. A personal communications device according to claim 9 wherein the means for receiving a telecommunications signal includes the means for generating a clock source signal, and wherein the means for generating a clock source signal comprises a crystal oscillator.

* * * * *

(12) EX PARTE REEXAMINATION CERTIFICATE (7115th)
United States Patent
Underbrink

(10) Number: US 6,650,879 C1
(45) Certificate Issued: Oct. 20, 2009

(54) PERSONAL COMMUNICATIONS DEVICE WITH GPS RECEIVER AND COMMON CLOCK SOURCE

(75) Inventor: Paul A. Underbrink, Lake Forest, CA (US)

(73) Assignee: SIRF Technology, Inc., San Jose, CA (US)

Reexamination Request:
No. 90/010,291, Sep. 19, 2008

Reexamination Certificate for:
Patent No.: 6,650,879
Issued: Nov. 18, 2003
Appl. No.: 09/551,060
Filed: Apr. 18, 2000

(51) Int. Cl.
*G01S 1/00* (2006.01)
*H03L 7/081* (2006.01)
*H03L 7/08* (2006.01)
*H03L 7/197* (2006.01)
*H03L 7/16* (2006.01)

(52) U.S. Cl. .................. 455/255; 455/259; 455/13.2

(58) Field of Classification Search .................. None
See application file for complete search history.

(56) References Cited

U.S. PATENT DOCUMENTS 5,841,396 A 11/1998 Krasner
6,300,899 B1 10/2001 King

FOREIGN PATENT DOCUMENTS

WO  WO 00/02316 A1  1/2000

*Primary Examiner*—Deandra M Hughes

(57) ABSTRACT

The invention is directed to a personal telecommunications device having both global positioning systems (GPS) and telecommunications provisions which share a common clock source. GPS provisions include a feedback loop for controlling an oscillator that generates a GPS system signal based upon the common clock signal. The feedback loop includes a frequency synthesizer for generating a feedback control signal, a phase comparator for generating a control signal in accordance with the feedback signal and the common clock signal, and a loop filter for processing and outputting the control signal to the oscillator to control the frequency of GPS system signals.

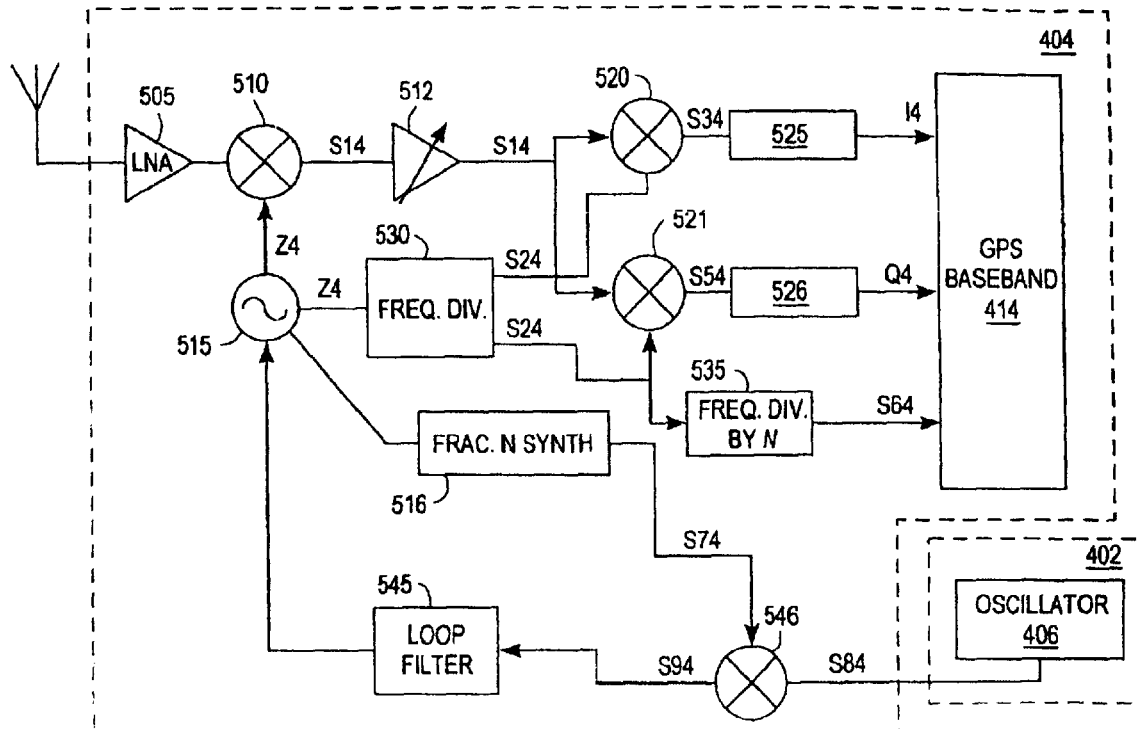

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 12–14 is confirmed.

Claims 2 and 6 are cancelled.

Claims 1, 4–5, 8 and are determined to be patentable as amended.

Claims 3 and 7, dependent on an amended claim, are determined to be patentable.

Claims 9–11 were not reexamined.

1. A personal communications device comprising:
   a telecommunications unit comprising a code division multiple access (CDMA) device, wherein the telecommunications unit further comprises a clock source; and
   a global positioning system (GPS) receiver, wherein the GPS receiver comprises,
   a voltage controlled oscillator for generating a GPS system clock signal based upon the clock source, and
   a feedback loop for controlling the voltage controlled oscillator, wherein the feedback loop comprises,
   a phase comparator for generating a control signal in accordance with [the] *a* feedback signal and the clock source; and
   a loop filter for processing the control signal and outputting the control signal to the voltage controlled oscillator, *and wherein the clock source provides a common clock signal to the global positioning receiver and the telecommunications unit.*

4. The personal communications device of claim 1 wherein the *feedback loop further comprises a* frequency synthesizer [comprises] *that includes*:
   a controlled oscillator having a variable output controlled by an input signal;
   a frequency divider coupled to receive the output of the controlled oscillator and responsive to the output to provide a frequency divided output signal;
   a phase compensation circuit coupled to receive the frequency divided output signal from the frequency divider, the phase compensation circuit responsive to the frequency divided output signal to provide an output which compensates for phase lag of the frequency divided output of the frequency divider; and
   a phase detector coupled to receive an output of the phase compensation circuit and the GPS system clock signal and to output a signal proportional to difference in phase between the output of the phase compensation circuit and the GPS system clock signal to control the controlled oscillator.

5. The personal communications device of claim [1] *4* wherein the divider is a fractional-N divider.

8. The personal communications device of claim [1] *7* wherein the switch is permanently set during manufacture.

* * * * *